United States Patent [19]

Fohl

[11] 4,186,424
[45] Jan. 29, 1980

[54] PHOTOFLASH UNIT HAVING LAMP ARRAYS ON OPPOSING SIDES

[75] Inventor: Timothy Fohl, Carlisle, Mass.

[73] Assignee: GTE Sylvania Incorporated, Stamford, Conn.

[21] Appl. No.: 878,699

[22] Filed: Feb. 17, 1978

[51] Int. Cl.² ............................................. G03B 15/02
[52] U.S. Cl. ........................................ 362/13; 362/16; 362/236; 362/240; 362/368
[58] Field of Search .................... 362/11, 13, 368, 227, 362/16, 236, 240

[56] References Cited

U.S. PATENT DOCUMENTS 4,048,487  9/1977  Kewley ................................. 362/13

Primary Examiner—Stephen J. Lechert, Jr.
Attorney, Agent, or Firm—Lawrence R. Fraley

[57] ABSTRACT

A photoflash lamp unit having an array of eight flash lamps located on each of two opposing sides thereof. Each array comprises two regions, upper and lower, of four lamps. A pivotal mounting device at a lower end of the unit permits the four lamps in one upper region to be fired after which the entire unit is rotated and the four lamps in the remaining, opposing upper region are fired. The unit is then inverted and the eight lamps in the two previously lower regions are fired in the manner described above.

13 Claims, 6 Drawing Figures

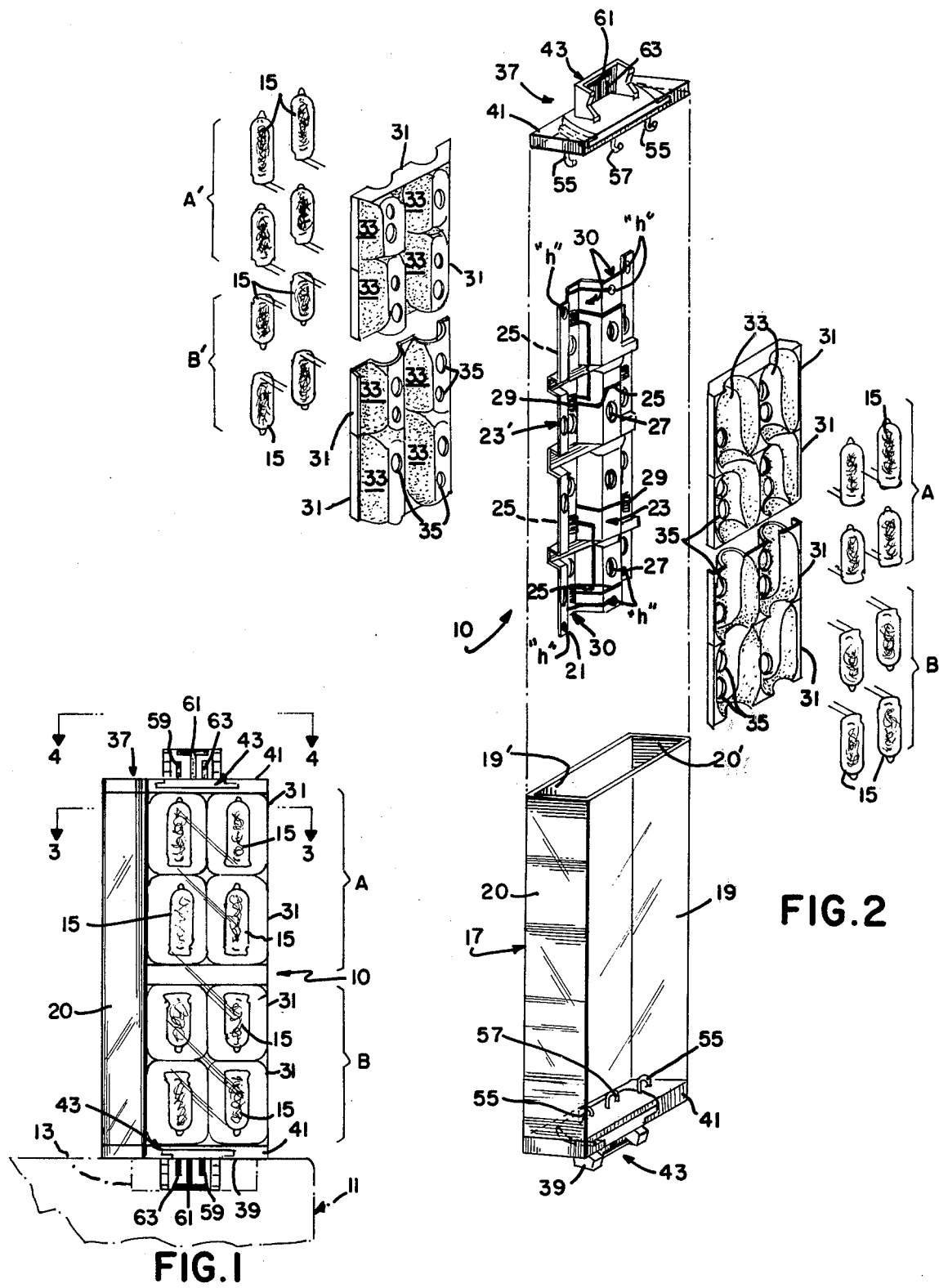

PHOTOFLASH UNIT HAVING LAMP ARRAYS ON OPPOSING SIDES

BACKGROUND OF THE INVENTION

The invention relates to photoflash lamp units adapted for being mounted on or inserted within cameras or attachments associated therewith. More particularly, the invention relates to such units which are electrically activated.

A currently marketed photoflash unit of the aforementioned type is described in U.S. Pat. No. 3,894,226 (Hanson) and referred to as a flip-flash. The unit comprises a planar array of eight high voltage type flash lamps mounted on a printed circuit board with an array of respectively associated reflectors disposed therewith. The lamps are arranged in two groups of four disposed on the upper and lower halves, respectively, of the rectangular shaped circuit board. A set of terminal contacts at the lower end of the unit is provided for activation of the upper group of lamps, while a set of terminal contacts at the top of the unit is operatively associated with the lower group of four lamps. The application of successive high voltage pulses (e.g., 500 to 4000 volts from a piezoelectric source controlled by the shutter of a camera (in which the array is inserted) to the terminal contacts at the lower end of the unit causes the four lamps at the upper half of the array to be sequentially-ignited. The array may then be inverted and inserted into the camera to flash the remaining four lamps. The flip-flash and similar devices have proven to be very reliable in photographic applications. Additionally, such units are relatively inexpensive to produce and easy to operate, even for the novice photographer. Present day flip-flash units possess one inherent disadvantage, however. Most contain only eight or fewer lamps and are thus unable to adequately complement the number of photographs available in most of today's film packs. Many packs, particularly those for use in the currently popular pocket-type cameras, contain from 12 to 20 photographs each. If a photographer was desirous of shooting more than eight pictures requiring supplemental lighting from a single pack of film it was therefore necessary to purchase at least two of the aforedescribed flip-flash units. Not only did this requirement prove costly, but it also increased the number of items which the photographer was required to carry.

It is believed therefore that a photoflash lamp unit which provides considerably more than eight flashes per unit, is relatively inexpensive to produce, and can be easily operated by even the novice photographer would constitute a significant advancement in the art.

From the following description, it will be further understood that the lamp unit of the invention, like the above flip-flash, is able to substantially eliminate the occurrence of the photographic phenomenon known as "red-eye". When the flash lamps are close to the camera's lens axis, such as within a few inches, and especially with the small pocket cameras, there is a tendency for an undesirable "red-eye" effect to occur (e.g., a red coloring of the pupils of persons in the picture). This results from the flash of light entering the subject's pupils and illuminating the retinas in the eyes at regions approximately in line with the optical axis of the camera's lens, so that the illuminated red coloring of the retina shows in the picture and causes the person's pupils to appear red. As stated, the photoflash lamp unit of the instant invention substantially eliminates this undesirable occurrence.

OBJECT AND SUMMARY OF THE INVENTION

It is a primary object of the present invention to enhance the photoflash lamp art by providing a photoflash lamp unit having the features cited above.

In accordance with one aspect of the invention, a photoflash lamp unit is described which includes a housing with light-transmitting sides, a circuit board with first and second opposing surfaces each having lamp-firing circuitry thereon, and a plurality of flash lamps positioned on each of the board's opposing surfaces in electrical contact with the lamp-firing circuitry. The lamps are oriented on each surface in at least two regions with the lamps in the regions on one surface facing in an opposing direction from the lamps in the corresponding regions on the other surface. First and second mounting devices are included for electrically connecting the lamps with the power source associated with the camera with which the unit is utilized. Each device connects the lamps in the corresponding, opposing regions located at a spaced distance from the device.

BRIEF DESCRIPTION OF THE DRAWINGS

FIG. 1 is a front elevational view of a photoflash lamp unit in accordance with a preferred embodiment of the invention;

FIG. 2 is an exploded isometric view of the unit of FIG. 1;

DETAILED DESCRIPTION OF THE PREFERRED EMBODIMENTS

Figure 3:
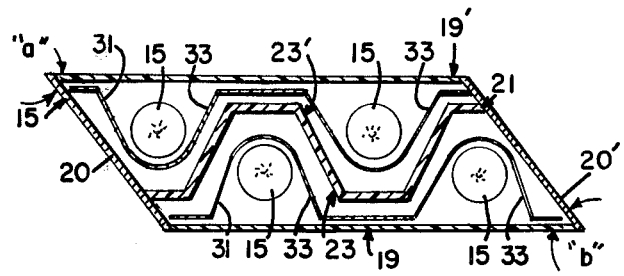
FIG. 3 is a section view of the invention as taken along the line 3—3 in FIG. 1.
Figure 4:
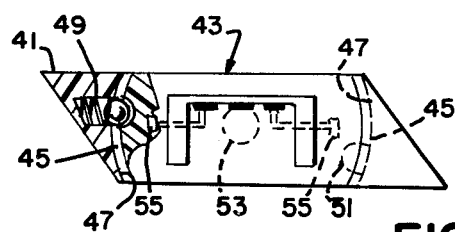
FIG. 4 is a plan view, taken along the line 4—4 in FIG. 1, of one form of connecting device for use with the invention.
Figure 5:
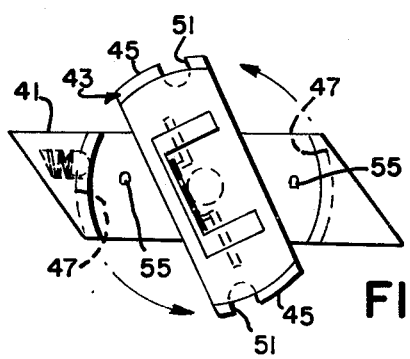
FIG. 5 is a plan view illustrating the device of FIG. 4 in a partially rotated position.

For a better understanding of the present invention together with other and further objects, advantages and capabilities thereof, reference is made to the following disclosure and appended claims in connection with the above described drawings.

With particular attention to FIG. 1, a photoflash lamp unit 10 in accordance with a preferred embodiment of the invention is shown mounted atop a camera 11 (phantom) and adapted for being electrically activated by a series of pulses provided by a power source (not shown) typically associated with camera 11. This power source may comprise a piezoelectric crystal which is mechanically actuated within camera 11 whenever the camera's picture-taking lever (not shown) is depressed. Accordingly, a firing pulse is applied to the camera's socket 13, said pulse sufficient to activate at least one of the electrical flash lamps 15 within unit 10. Unit 10 is designed such that the lamps 15 in an upper region A will be fired when the unit is positioned in the manner shown. Thereafter, the unit is rotated 180° and a plurality of lamps in a region located immediately behind the lamps in region A will be fired. A total of eight lamps will therefore be fired when unit 10 is oriented on camera 11 in the manner shown in FIG. 1. Unit 10 is then removed from camera 11, inverted, and positioned again within socket 13. Accordingly, the lamps in the previously lower region (B) are now fired. After all four have been activated, unit 10 is again rotated 180° and four more lamps in a region corresponding to and immediately behind region B are moved into position for firing.

Unit 10 thus provides a minimum of 16 flashes for the photographer using camera 11 and each flash is spaced sufficiently from the camera's lens to substantially prevent the deleterious phenomenon called "red-eye".

In comparing FIG. 1 with FIG. 2 (which shows an exploded isometric of the invention), unit 10 further comprises an insulative (e.g. plastic) housing 17 which includes first and second opposing light-transmitting sides 19 and 19', respectively. Sides 19 and 19' are preferably parallel and are interconnected by opaque, parallel sides 20 and 20'. In cross section (FIG. 3), housing 17 thus possesses the configuration of a parallelogram having opposite acute angles "a" and "b" each having an angular displacement from about 30 to 40 degrees. Unit 10 also comprises a circuit board 21 which includes two opposing surfaces 23 and 23' each having lamp-firing circuitry 25 thereon. Circuitry 25 on surface 23', while not shown directly in FIG. 2, is preferably a mirror image of the circuitry 25 shown on surface 23. Circuitry 25 is preferably a "printed circuit" and is applied to board 21 using techniques well known in the art. Circuitry 25 on each of the surfaces 23 and 23' also includes a series of disconnect switch strips 27 and several radiant energy-activated switches 29, said members described fully in U.S. Pat. No. 4,017,728 (E. G. Audesse et al), the disclosure of which is incorporated herein by reference. Accordingly, further description of these elements of the invention is not believed necessary. It is only considered important to note that the circuitry of the invention functions in much the same manner as that in U.S. Pat. No. 4,017,728 to assure the lamp firing order described above when unit 10 is inserted within the designated socket 13.

Board 21 fits within housing 11 such that surfaces 23 and 23' face the housing's light-transmitting sides 19 and 19', respectively. The embodiment in FIG. 3 represents a better illustration of this relationship.

As stated, unit 10 includes a plurality (e.g. 16) of electrically-activated flash lamps 15 which are mounted on board 21 such that each is in electrical contact with circuitry 25. The lamps 15 on surface 23 occupy the aforedescribed adjacent regions A and B while the lamps 15 on surface 23' occupy two similar and opposing regions A' and B'. As shown, regions A' and B' are located immediately behind regions A and B, respectively.

Each of the described regions includes four lamps for the defined total of 16. Board 21 is preferably of zigzag configuration in cross section to define opposing pairs of vertical rows of recesses 30. Each pair, containing two rows, is defined by the respective surface of board 21 and is specifically designed to accommodate the lamps positioned on that surface. Accordingly, each row will accommodate four vertically-oriented lamps. A zigzag cross-sectional configuration for board 21, in combination with the parallelogram cross-sectional configuration for housing 17, facilitates miniaturization of unit 10, which is of course highly desired in the photoflash lamp unit field.

To enhance the output of lamps 15, it is preferred to utilize a plurality of reflector components 31. Each component 31 is preferably associated with at least two lamps 15 and is thus located within housing 17 adjacent thereto. A total of eight reflector components 31 are thereby utilized in unit 10 with two such members located in each of the defined lamp regions. As shown with particularity in FIGS. 2 and 3, each component 31 comprises two individual reflecting portions 33 which are indented (or recessed) to house a respective lamp 15. Accordingly, the intense flash of light from the lamps in regions A and B is directed toward and through side 19 of housing 17 while the light from the lamps in regions A' and B' is directed toward and through opposing side 19'.

Reflector components 31 also include a plurality of openings or apertures 35 therein to assure that radiation from the respective lamps 15 reaches the aforedescribed switches 27 and 29 located adjacent thereto so that these components can operate as designed. This mode of operation is described in the above-cited U.S. Pat. No. 4,017,728.

Unit 10 further comprises first and second mounting devices 37 and 39 respectively. First device 37 may be secured to housing 17 at the top thereof or it may constitute a part of the upper portion of housing 17. Preferably, each of the devices 37 and 39 are separate components from the plastic housing 17 and are secured thereto at the top and bottom, respectively, by epoxy or similar bonding material.

Device 37 is spaced from second regions B and B' of lamps 15 by first regions A and A', respectively, and electrically interconnects the lamps in regions B and B' with the aforedescribed power source associated with camera 11. Device 39 is spaced from first regions A and A' by regions B and B', respectively, and provides connection to the lamps in regions A and A'.

The mounting devices of FIGS. 1, 2, 4, and 5 are capable of providing rotational movement to unit 10 to effect the aforedescribed lamp firing procedure. Each mounting device includes a base member 41 which secures to housing 17, and an upstanding tabular member 43 which fits within the designated camera socket 13. Tabular member 43 is rotatably oriented within base member 41 and includes a pair of opposed ribs 45 (FIGS. 4 and 5) which mate with a corresponding pair of opposed slots 47 within base 41 when unit 10 is in the defined firing positions. Rotatable tab 43 is locked in these two described positions by a detent mechanism 49 (ball and spring) which engages one of two opposed indentations 51 provided within tab 43 for this purpose. Tab member 43 rotates about a central pivot shaft 53 (FIG. 4) which extends therein and is secured within base 41. Also within base 41 is a pair of contacts 55 which project through the base and depend therefrom (FIG. 2). A third contact is joined to shaft 53 and extends therefrom to also depend from base 41. This third contact is indicated by numeral 57 in FIG. 2. When the device is in the firing position (FIG. 4), contacts 55 and 57 are electrically connected to three separate circuit paths (lamp-firing circuitry) located on one surface of tab 43. With reference to FIG. 1, these paths are indicated by numerals 59, 61, and 63. Circuit paths 59 and 63 are thus connected electrically to outside contacts 55 in FIG. 4 while center path 61 ("T-shaped" in FIGS. 1 and 2) is electrically joined to contact 57. The lamp-firing circuitry on tab 43 aligns with corresponding circuitry within the camera's socket 13 and operates in a manner known in the art (e.g., such as described in U.S. Pat. No. 4,017,728).

Contacts 55 and 57 each include hooklike end portions which engage and connect to designated areas of circuitry 25 on board 21 to provide electrical connection thereto. This connection is accomplished when the hooklike ends are secured within corresponding holes "h" in the end of board 21. Circuitry 25 encircles each hole "h" and the hooklike ends are crimped therein and soldered. As shown, three separate holes "h" are provided in each end of board 21 with one hole accommodating a corresponding single contact. In the broader aspects of the invention, it is possible to eliminate any one of the aforedescribed contacts from each of the mounting devices. Utilization of but two contacts would further result in eliminating the need for one of the holes "h" from each end of board 21 as well as one of the circuit paths from tabs 43. It is of course understood that the circuitry on board 21 would be modified accordingly. An example of a photoflash unit employing only two conductive paths at each end is described in U.S. Pat. No. 3,990,833 (Holub et al).

Figure 6:
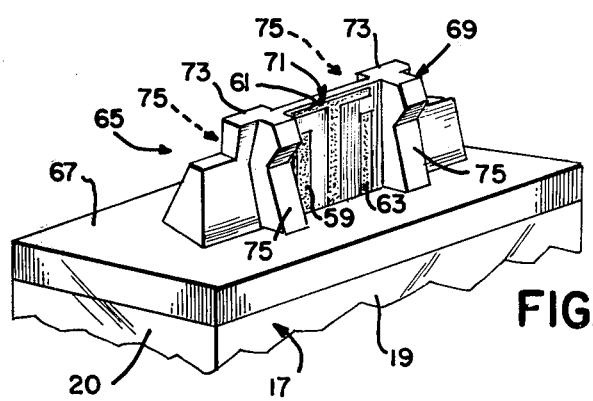
FIG. 6 is an isometric view of an alternate embodiment of a connecting device for use with the invention.

In FIG. 6 is shown an alternate embodiment of a mounting device for use with the invention. Device 65 includes a base member 67 secured to the end of housing 17 and an upstanding tabular member 69 which includes a central wall portion 71. On opposing sides of wall 71 is located a plurality of lamp-firing circuit paths 59, 61, and 63 similar to those on devices 37 and 39. These paths mate with corresponding circuitry within socket 13. Again within the broader aspects of the invention, it is understood that only two circuit paths need be employed. Device 65 also includes a pair of spaced shoulder portions 73 to facilitate alignment within the camera socket. Although not fully shown, it is understood that the circuitry on the hidden side of wall 71 is a mirror image of that illustrated on the facing side. It is also understood that shoulders 73 include the same notched segments 75 as shown on the facing sides of these elements. Circuit paths 59, 61 and 63 are in turn electrically joined to three conductive leads similar to contacts 55 and 57 (FIG. 2) located within base member 67. These leads (not shown) extend through base 67 and make connection with circuitry 25 in the same manner as contacts 55 and 57.

The operation of unit 10 having devices 65 thereon differs from one having the described devices 37 and 39 in that the unit is not rotated upon firing the first, upper region of lamps. Instead, the unit must be removed from the camera's socket to effect rotation. After both upper lamp regions have been flashed, the unit is inverted and the above sequence repeated for the remaining lamps.

In the preferred embodiments of the invention, devices 37, 39, and 67 are plastic, circuit board 41 is made from well known board materials, e.g. polystyrene, reflector components 31 are aluminum-coated plastic, and lamps 15 are of the high voltage type as described in U.S. Pat. Nos. 4,059,388 (Shaffer) and 4,059,389 (Armstrong). Such lamps typically include a hard glass envelope and a quantity of combustible shredded material (e.g. zirconium) therein which ignites upon application of a sufficient pulse across the lamp's projecting leads.

With further regard to the invention, it is preferred that the lamps on each of the opposing sides of the unit's circuit board occupy a singular plane and that these two planes be parallel.

Thus there has been shown and described a unique photoflash lamp unit which is easy and inexpensive to produce, can be easily operated by even the novice photographer, and can be readily carried in the pocket of said photographer. The invention doubles the total number of flashes available in most present units without adding appreciably to the overall width and thickness of such units.

While there have been shown and described what are at present considered the preferred embodiments of the invention, it will be obvious to those skilled in the art that various changes and modifications may be made therein without departing from the scope of the invention as defined by the appended claims.

What is claimed is:

1. A photoflash lamp unit for being electrically activated when connected to a power source associated with a camera, said lamp unit comprising:
   a housing including first and second opposing light-transmitting sides;
   a circuit board positioned within said housing and including first and second opposing surfaces each having lamp-firing circuitry thereon, said first and second opposing surfaces facing said first and second light-transmitting sides, respectively;
   a first plurality of electrically-activated flash lamps located within said housing and positioned on said first opposing surface of said circuit board in electrical contact with said lamp-firing circuitry thereon, said first plurality of flash lamps occupying first and second regions on said first surface of said board;
   a second plurality of electically-activated flash lamps located within said housing and positioned on said second opposing surface of said circuit board in electrical contact with said lamp-firing circuitry thereon, said second plurality of flash lamps occupying first and second regions on said first surface substantially opposite said first and second regions on said second surface, respectively; and
   first and second mounting devices secured to said housing or forming a part thereof, said first mounting device spacedly positioned from said second regions of lamps on said first and second surfaces of said circuit board by said first regions on said first and second surfaces, respectively, said first mounting device for selectively connecting said lamps in each of said second regions to said power source associated with said camera when said first mounting device is electrically connected to said power source, said second mounting device spacedly positioned from said first regions of lamps on said first and second surfaces of said circuit board by said second regions on said first and second surfaces, respectively, said second mounting device for selectively connecting said lamps in each of said first regions to said power source associated with said camera when said second mounting device is electrically connected to said power source.

2. The photoflash lamp unit according to claim 1 wherein said first and second light-transmitting sides are parallel.

3. The photoflash lamp unit according to claim 2 wherein the cross-sectional configuration of said housing is a parallelogram having opposite acute angles each within the range of about 30 to about 40 degrees.

4. The photoflash lamp unit according to claim 3 wherein said lamps on said first and second surfaces of said circuit board occupy first and second planes, respectively, said first and second planes parallel to each other.

5. The photoflash lamp unit according to claim 1 wherein said circuit board is of substantially zigzag cross-sectional configuration to define a series of recesses within each of said opposing surfaces, said lamps positioned on each of said opposing surfaces located substantially within said recesses.

6. The photoflash lamp unit according to claim 1 further including at least one reflector component positioned within said housing relative to each of said regions of lamps, said reflector component associated with at least one of said lamps for directing the light output therefrom toward the respective one of said light-transmitting sides.

7. The photoflash lamp unit according to claim 6 wherein the number of reflector components relative to each of said regions is two, each of said components associated with two of said flash lamps.

8. The photoflash lamp unit according to claim 1 wherein the number of flash lamps in each of said first and second regions is four.

9. The photoflash lamp unit according to claim 1 wherein each of said mounting devices is adapted for providing rotational movement of said unit on said camera.

10. The photoflash lamp unit according to claim 9 wherein each of said mounting devices comprises a base member secured to said housing and a tabular member rotatably oriented within said base member for occupying first and second substantially secured positions therein.

11. The photoflash lamp unit according to claim 10 wherein said tabular member includes lamp-firing circuitry thereon and said base member includes at least two electrical contacts electrically connected to predetermined portions of said lamp-firing circuitry on said circuit board, said lamp firing circuitry electrically joined to said contacts when said tabular member occupies said first and second secured positions.

12. The photoflash lamp unit according to claim 10 wherein each of said mounting devices includes a detent mechanism for maintaining said device within each of said secured positions.

13. The photoflash lamp unit according to claim 1 wherein each of said mounting devices comprises a base member secured to said housing and a tabular member, said tabular member including two opposing surfaces each having lamp-firing circuitry thereon, said base member including at least two conductive leads electrically connected to predetermined portions of said lamp-firing circuitry on said circuit board, said lamp-firing circuitry on each of said opposing surfaces of said tabular member electrically joined to said conductive leads.

* * * * *